(12) United States Patent
Zhu (10) Patent No.: US 9,338,921 B2
(45) Date of Patent: May 10, 2016

(54) FIXING MECHANISM FOR A CIRCUIT BOARD AND RELATED ELECTRONIC DEVICE

(71) Applicant: Wistron Corporation, New Taipei (TW)

(72) Inventor: Chong-Xing Zhu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 107 days.

(21) Appl. No.: 14/503,387

(22) Filed: Sep. 30, 2014

(65) Prior Publication Data

US 2015/0098199 A1    Apr. 9, 2015

(30) Foreign Application Priority Data

Oct. 9, 2013  (CN) ...................... 2013 2 0621251 U (51) Int. Cl.
*H05K 5/00* (2006.01)
*H05K 7/14* (2006.01)

(52) U.S. Cl.
CPC ..................................... *H05K 7/142* (2013.01)

(58) Field of Classification Search
USPC ........................ 361/752, 748, 736
See application file for complete search history.

(56) References Cited

U.S. PATENT DOCUMENTS

| 2013/0120945 A1* | 5/2013 | Zhao | ...................... H05K 7/142 361/759 |
| 2014/0346298 A1* | 11/2014 | Tsai | ...................... G11B 33/124 248/224.8 |

FOREIGN PATENT DOCUMENTS

TW        I442873        6/2014

* cited by examiner

*Primary Examiner* — Andargie M Aychillhum
(74) *Attorney, Agent, or Firm* — Winston Hsu; Scott Margo (57) ABSTRACT

A fixing mechanism includes a casing and a positioning component. The casing includes a base and at least one wall whereon an opening is formed. A bottom of the positioning component is disposed on the base, and a top of the positioning component includes a level difference structure, which includes a first support surface and a second support surface. The first support surface is formed on an inner of the level difference structure, and the second support surface surrounds the first support surface to form on an outer of the level difference structure. The first support surface is higher than the second support surface relative to the base. The positioning component contacts the circuit board via the first support surface or the second support surface according to a hole on the circuit board, so as to align a connector of the circuit board with the opening on the casing.

19 Claims, 10 Drawing Sheets

FIXING MECHANISM FOR A CIRCUIT BOARD AND RELATED ELECTRONIC DEVICE

BACKGROUND OF THE INVENTION

1. Field of the Disclosure

The present disclosure relates to a fixing mechanism for a circuit board, and more particularly, to a fixing mechanism for the circuit board with any thickness dimension and a related electronic device.

2. Description of the Prior Art

Thickness of the circuit board is varied according to an amount of the layers and/or impedance parameters. The amount of the layers and structural thickness of the circuit board may be accordingly increased or decreased for additional functions of the circuit board. A base of the circuit board is disposed on a plurality of bosses, and a connector is formed on a top of the circuit board to align with an opening formed on the casing. The connector may not accurately align with the opening due to thickness variation of the circuit board. A conventional related solution is redesign of the casing, for example, a small boss is applied or position of the opening is adjusted to customize mechanical relation between the circuit board and the casing, and the connector can align with the opening since the circuit board with different thickness is installed inside the casing. The redesign casing is only applied to the circuit board with corresponding thickness, the circuit board with original thickness cannot apply to the redesign casing, and manufacturing cost of the electronic product is expensive. Therefore, design of a fixing mechanism capable of applying to the circuit board with any thickness to align the connector with the opening is an important issue of the related mechanical industry.

SUMMARY OF THE INVENTION

The present disclosure provides a fixing mechanism for the circuit board with any thickness dimension and a related electronic device for solving above drawbacks.

According to the claimed disclosure, a fixing mechanism for a circuit board is disclosed. The fixing mechanism includes a casing and a positioning component. The casing has a base and at least one wall. The wall is bent from the base, and an opening is formed on the wall. A bottom of the positioning component is disposed on the base, and a level difference structure is disposed on a top of the positioning component. The level difference structure includes a first support surface and a second support surface. The first support surface is formed on an inner zone of the level difference structure, and the second support surface surrounds the first support surface to be formed on an outer zone of the level difference structure. The positioning component is adapted to contact against the circuit board by the first support surface or the second support surface according to a hole formed on the circuit board, so as to align a connector of the circuit board with the opening on the casing.

According to the claimed disclosure, a distance between the first support surface and the bottom is substantially greater than a distance between the second support surface and the bottom.

According to the claimed disclosure, the positioning component utilizes the first support surface to contact against the circuit board with the small hole; or utilizes the second support surface to contact against the circuit board with the large hole, and the first support surface inserts into the hole.

According to the claimed disclosure, the positioning component includes a first annular body and a second annular body. The second annular body is detachably disposed on the first annular body. The first support surface is formed on a top of the first annular body, and the second support surface is formed on a top of the second annular body.

According to the claimed disclosure, thread structures are formed on an outer surface of the first annular body and an inner surface of the second annular body. The second annular body moves relative to the first annular body via the thread structures, so as to adjust relative height between the first support surface and the second support surface.

According to the claimed disclosure, the positioning component includes a first annular body and a second annular body. The second annular body is integrated with the first annular body monolithically, and a radial dimension of the first annular body is smaller than a radial dimension of the second annular body. The first support surface is formed on a top of the first annular body, and the second support surface is formed on a top of the second annular body.

According to the claimed disclosure, an electronic device with a circuit board fixing function is disclosure. The electronic device includes a circuit board having a hole, and a fixing mechanism for fixing the circuit board. The fixing mechanism includes a casing, a positioning component and a fixing component. The casing has a base and at least one wall. The wall is bent from the base, and an opening is formed on the wall. A bottom of the positioning component is disposed on the base, and a level difference structure is disposed on a top of the positioning component. The level difference structure includes a first support surface and a second support surface. The first support surface is formed on an inner zone of the level difference structure, and the second support surface surrounds the first support surface to be formed on an outer zone of the level difference structure. The positioning component is adapted to contact against the circuit board by the first support surface or the second support surface according to a hole formed on the circuit board, so as to align a connector of the circuit board with the opening on the casing. The positioning component further includes a hollow structure.

The fixing component is adapted to pierce through the hole on the circuit board to insert into the hollow structure of the positioning component.

The fixing mechanism of the present disclosure is suitable for the circuit board with any thickness. The thin circuit board or the fat circuit board can respectively contact against the corresponding support surface via the level difference structure of the positioning component, and the connector of the circuit board can accurately align with the opening on the casing no matter what thickness the circuit board has. The fixing mechanism can be easily applied to any kinds of the circuit board without replacement of the positioning component. The positioning component is preferably fixed to the casing by a rivet to constrain a relative movement between the positioning component and the casing for stable orientation. The positioning component is a vertical structure, such as the tube with a flat surface, and ends of the positioning component are respectively connected to the casing and the circuit board. There is more space on the circuit board for circuit configuration because of small contact area between the positioning component and the circuit board, and the casing including the small rivet hole has preferred structural strength. An amount of the support surface of the level difference structure is not limited to the two support surfaces of the above-mentioned embodiment, and depends on actual demand. Comparing to the prior art, the present disclosure provides the fixing mechanism capable of applying to any kinds of the circuit board without replacement of mechanical component, which has advantages of low manufacturing cost and superior assembly convenience.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
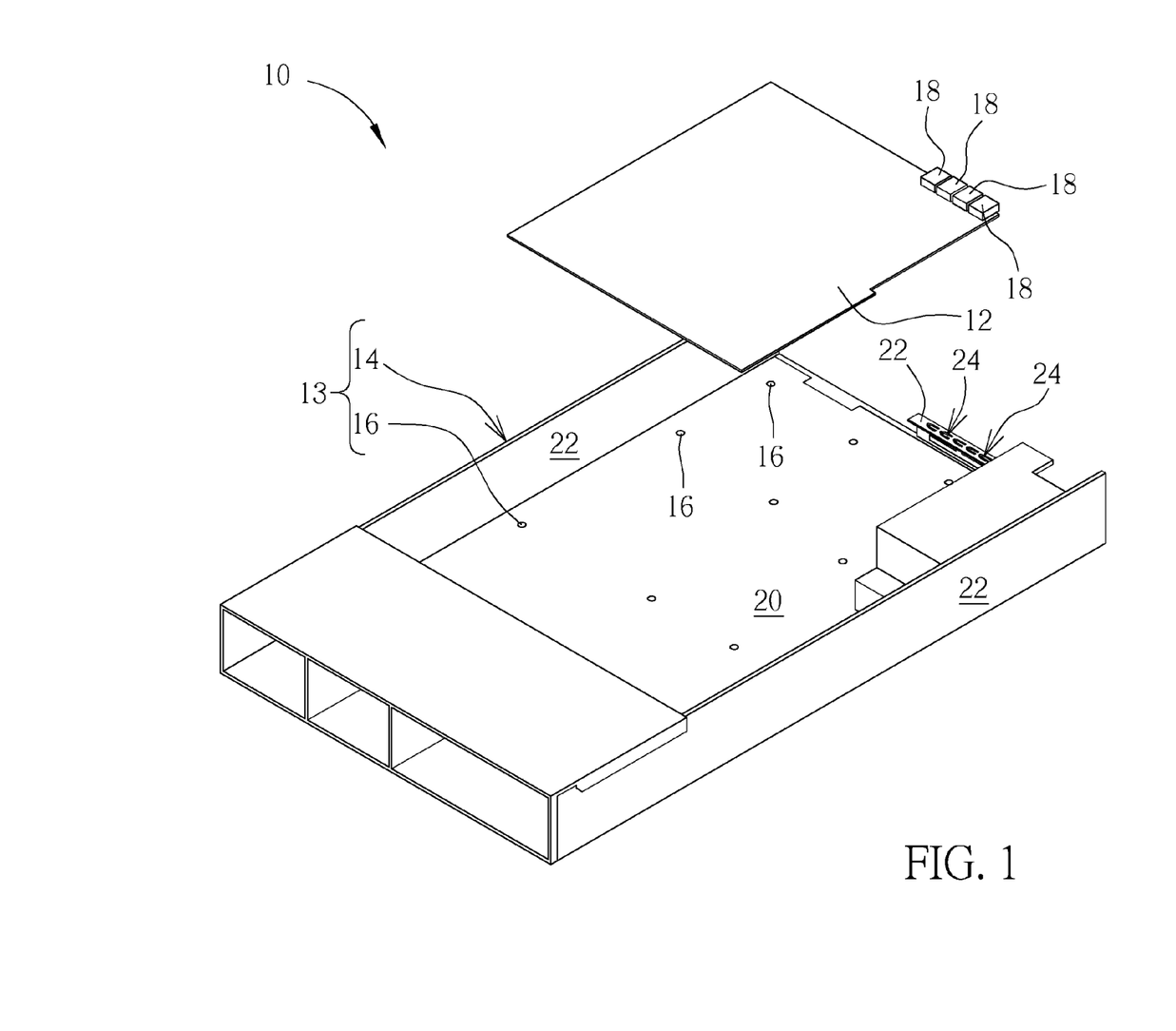
FIG. 1 is a diagram of an electronic device according to an embodiment of the present disclosure.

Please refer to FIG. 1. FIG. 1 is a diagram of an electronic device 10 according to an embodiment of the present disclosure. The electronic device 10 includes a circuit board 12 and a fixing mechanism 13 for the circuit board 12. The fixing mechanism 13 includes a casing 14 and a positioning component 16. The circuit board 12 can be a main board with a plurality of connectors 18, such as the universal serial bus (USB) connector or the telecommunications (RJ45) connector. The casing 14 includes a base 20 and a plurality of walls 22. Each of the walls 22 is bent from a corresponding edge of the base 20 to form an accommodating space. A plurality of opening 24 is formed on at least one wall 22 of the casing 14, and an amount of the 24 corresponds to an amount of the connector 18. The circuit board 12 is disposed on the base 20 by the plurality of positioning components 24 to accurately align the connector 18 with the corresponding opening 24. The positioning component 16 is disposed between the circuit board 12 and the casing 14 to hold the circuit board 12, so as to prevent the circuit board 12 from contacting the casing 14 and electric leakage.

Figure 2:
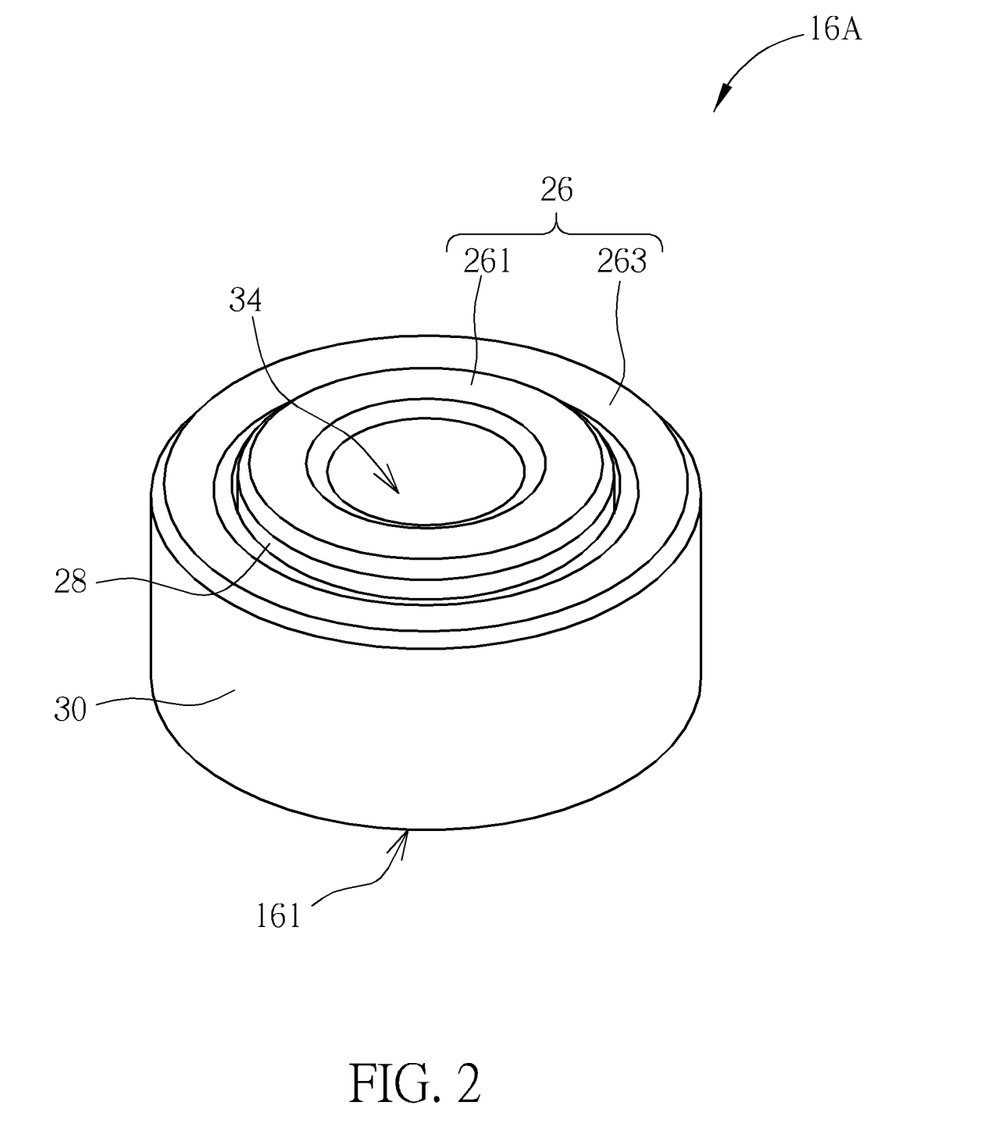
FIG. 2 is a diagram of a positioning component according to a first embodiment of the present disclosure.
Figure 3:
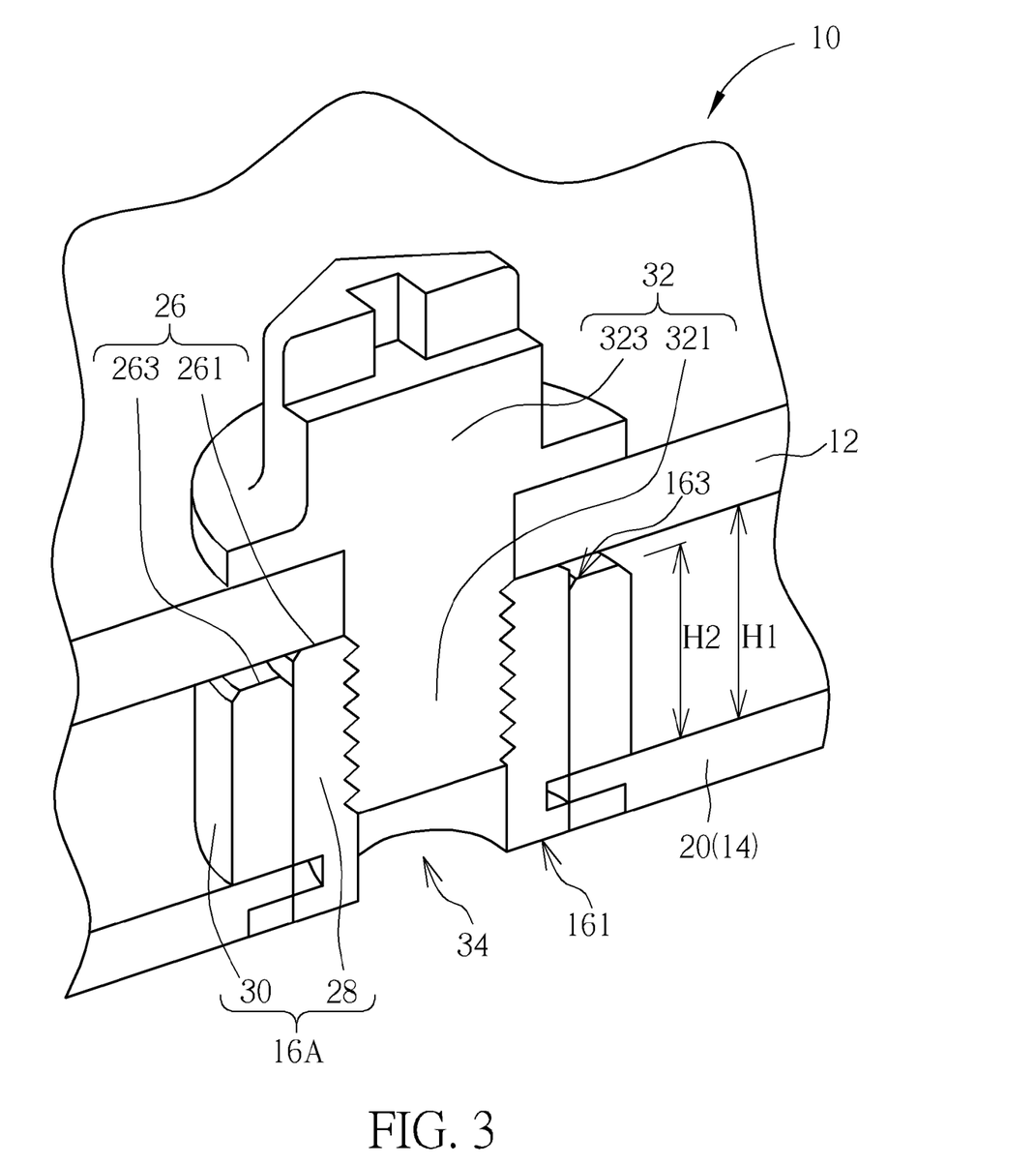
FIG. 3 and FIG. 4 respectively are sectional views of the positioning component and a circuit board with different dimensions according to the first embodiment of the present disclosure.
Figure 4:
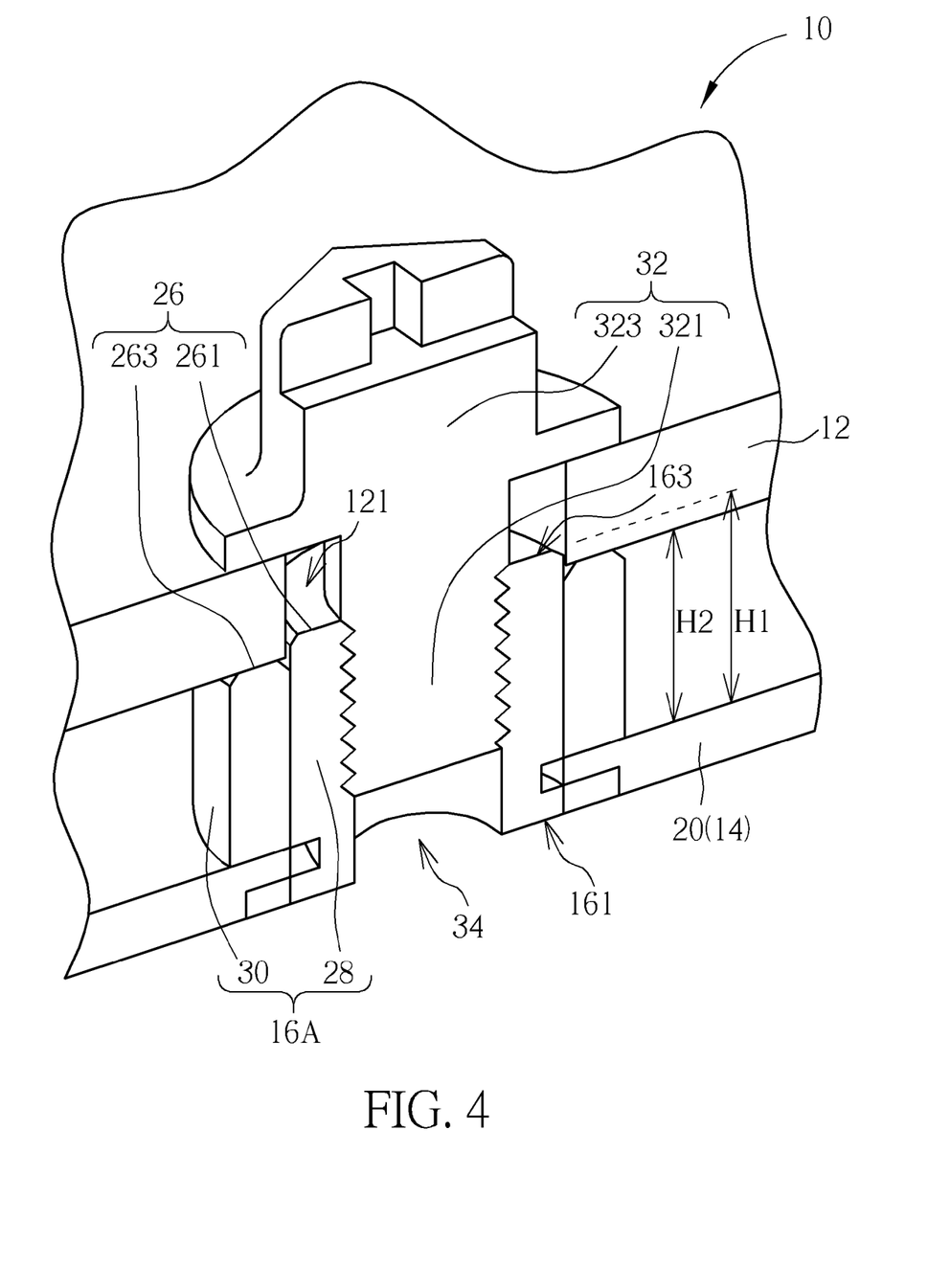

Please refer to FIG. 2 to FIG. 4. FIG. 2 is a diagram of the positioning component 16A according to a first embodiment of the present disclosure. FIG. 3 and FIG. 4 respectively are sectional views of the positioning component 16A and the circuit board 12 with different dimensions according to the first embodiment of the present disclosure. A bottom 161 of the positioning component 16A is disposed on the base 20 of the casing 14. A level difference structure 26 is disposed on a top 163 of the positioning component 16A. The level difference structure 26 at least includes a first support surface 261 and a second support surface 263. The level difference structure 26 utilizes the suitable support surface to hold the circuit board 12 according to thickness of the circuit board 12, so as to ensure that the connector 18 of the circuit board 12 with any dimension can accordingly align with the opening 24. The positioning component 16A includes a first annular body 28 and a second annular body 30. The second annular body 30 is detachably disposed on the first annular body 28. The first support surface 261 is formed on a top of the first annular body 28, and the second support surface 263 is formed on a top of the second annular body 30. It is to say, the first support surface 261 is formed on an inner zone of the level difference structure 26, the second support surface 263 surrounds the first support surface 261 and is formed on an outer zone of the level difference structure 26.

As shown in FIG. 3, a distance H1 between the first support surface 261 and the bottom 161 is substantially greater than a distance H2 between the second support surface 263 and the bottom 161, which means a structural height of the first annular body 28 is greater than a structural height of the second annular body 30. The circuit board 12 shown in FIG. 3 is the standard main board with thin dimensions. An aperture of the hole 121 is smaller than a radial dimension of the first support surface 261, and the first support surface 261 can contact against the circuit board 12 to provide an upward force since the circuit board 12 is put on the positioning component 16A. As shown in FIG. 4, the circuit board 12 is fat. The hole 121 formed on the circuit board 12 has large aperture to ensure that the connector 16 can accurately align with the opening 24. The aperture of the hole 121 is greater than the radial dimension of the first support surface 261, and smaller than a radial dimension of the second support surface 263. When the circuit board 12 is put on the positioning component 16A, the first support surface 261 inserts into the hole 121, and the second support surface 263 contacts against the circuit board 12. Comparing to the thin circuit board shown in FIG. 3, the fat circuit board 12 shown in FIG. 4 moves downwardly relative to the casing 14, and height difference between the fat circuit board 12 (shown in FIG. 4) and the thin circuit board (shown in FIG. 3) is substantially equal to vertical dimension difference between the first annular body 28 and the second annular body 30.

Besides, the fixing mechanism 13 further includes a fixing component 32, as shown in FIG. 3 and FIG. 4. An amount of the fixing component 32 corresponds to an amount of the positioning component 16. The fixing component 32 can be a screw or a bolt. The positioning component 16 includes a hollow structure 34 with inner thread. When the circuit board 12 is put on the positioning component 16, a body 321 of the fixing component 32 can pierce through the hole 121 on the circuit board 12 to be locked inside the hollow structure 34, and a block portion 323 of the fixing component 32 has dimensions larger than the aperture of the hole 121, so as to effectively constrain a movement of the circuit board 12 relative to the casing 14.

Figure 5:
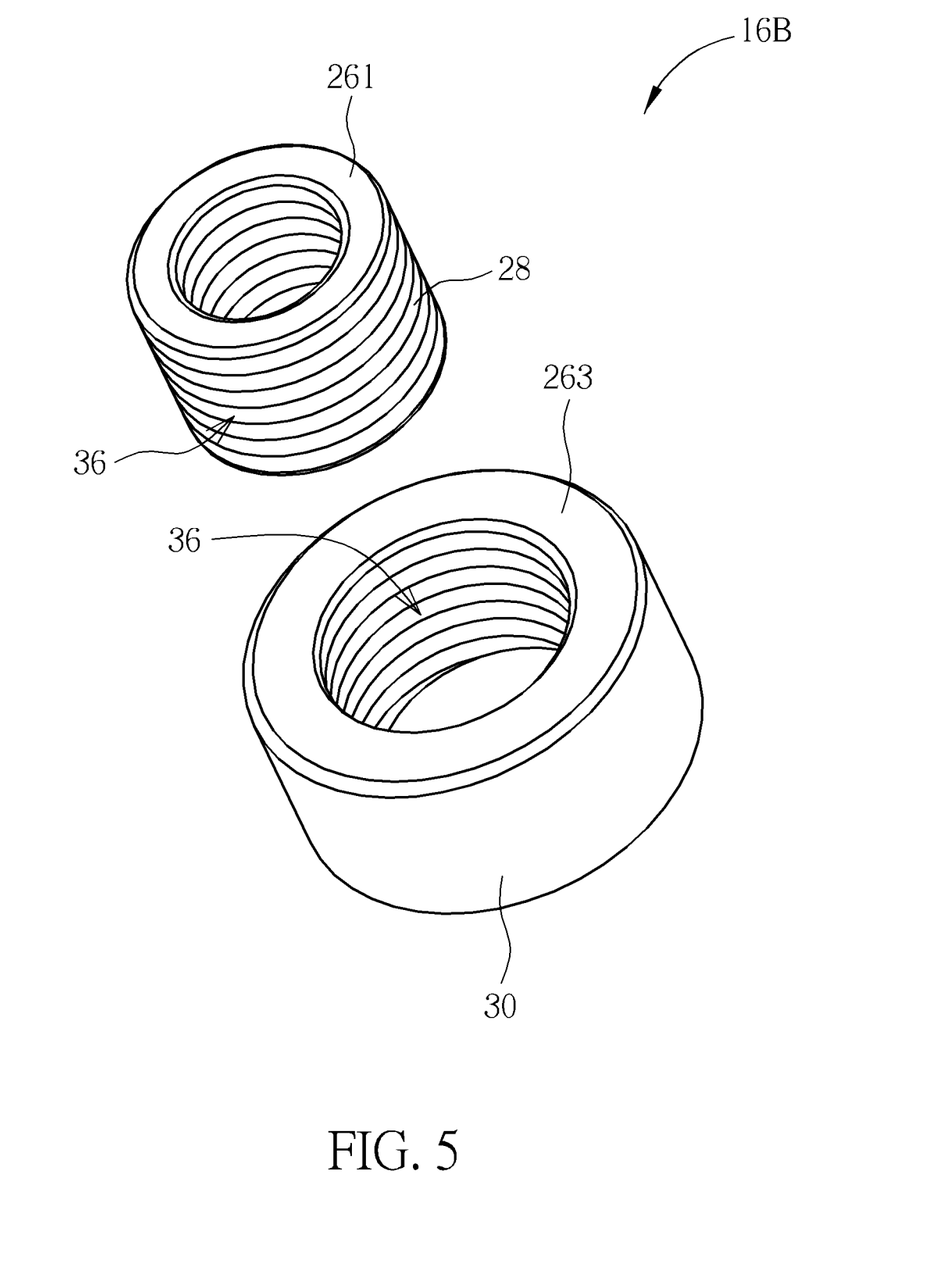
FIG. 5 is a diagram of the positioning component according to a second embodiment of the present disclosure.
Figure 6:
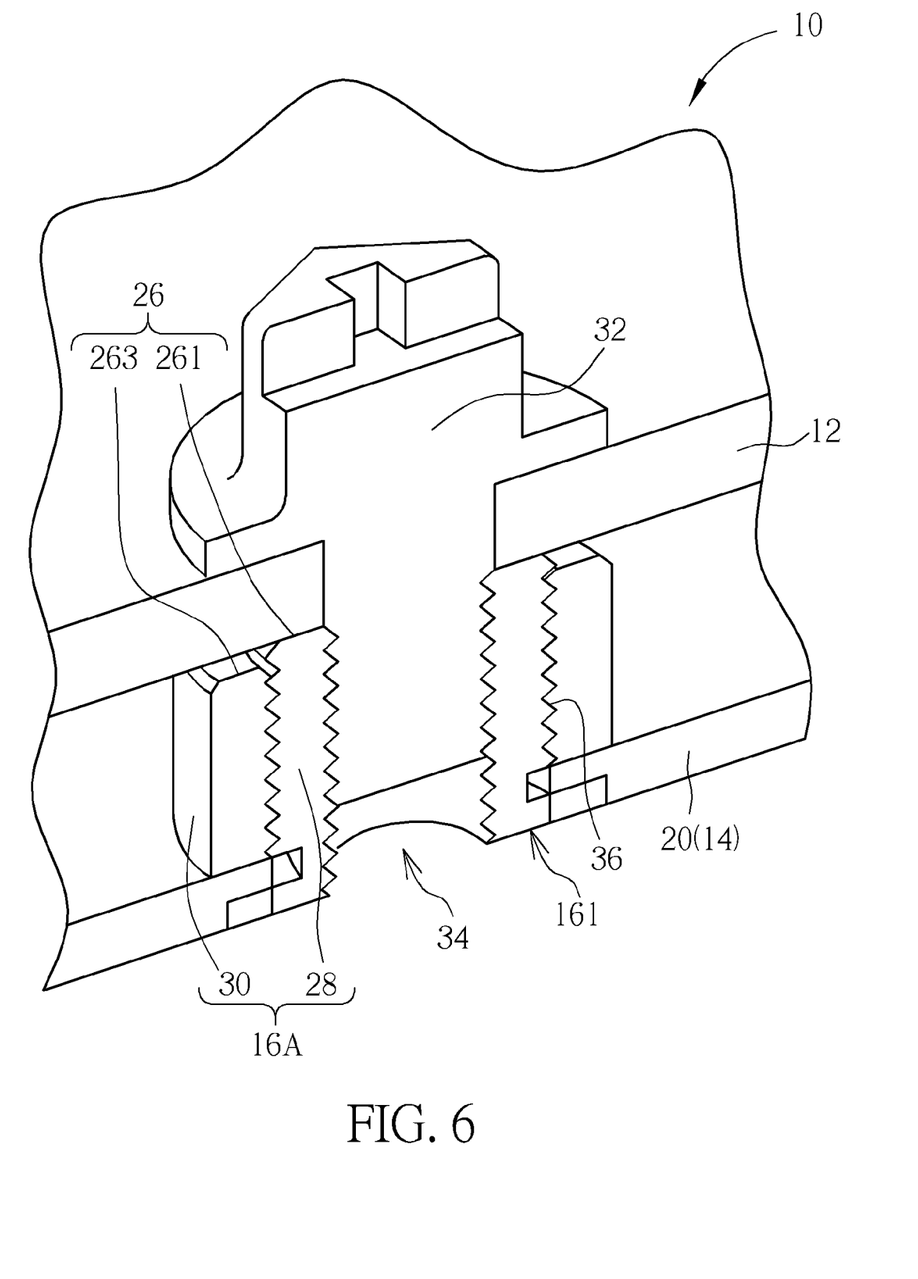
FIG. 6 and FIG. 7 respectively are sectional views of the positioning component and the circuit board with different dimensions according to the second embodiment of the present disclosure.
Figure 7:
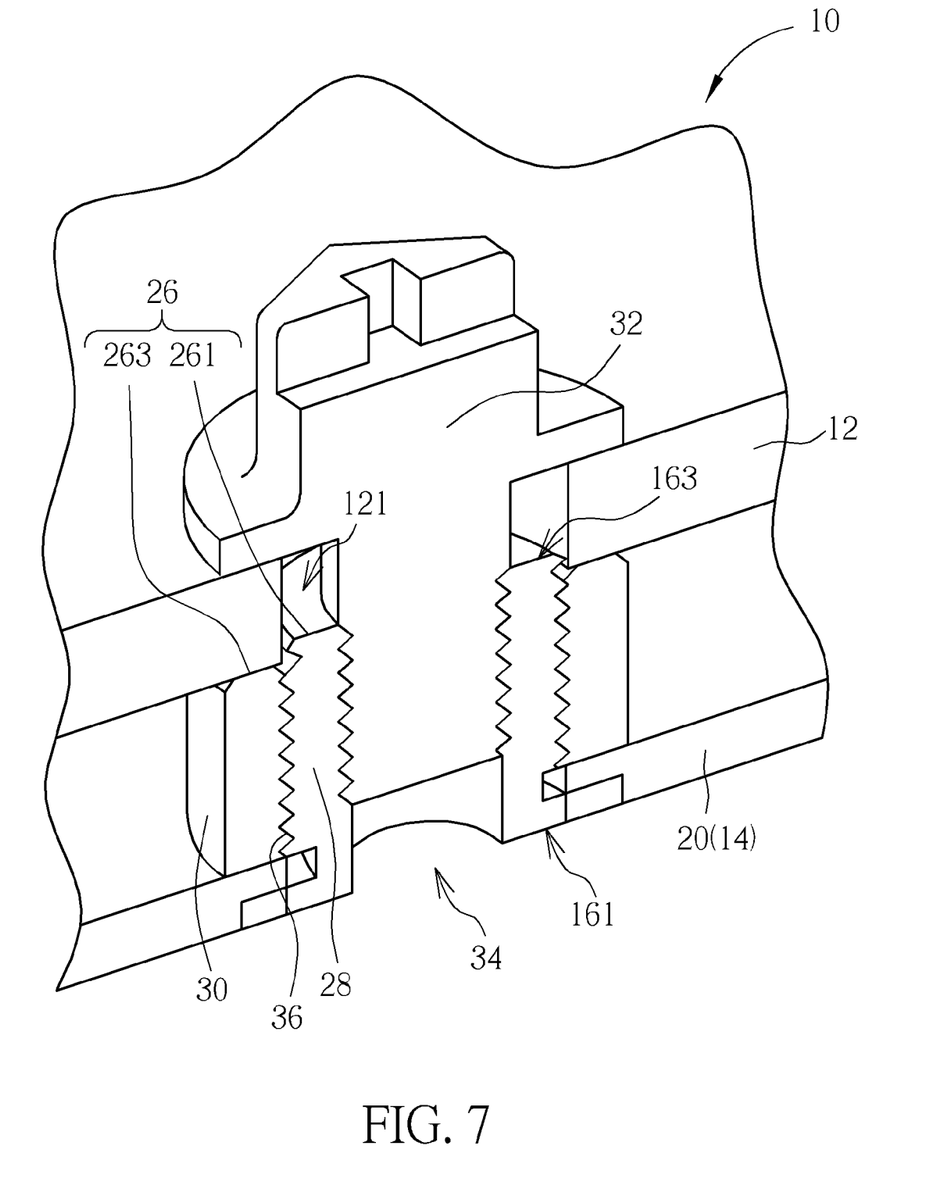

Please refer to FIG. 5 to FIG. 7. FIG. 5 is a diagram of the positioning component 16B according to a second embodiment of the present disclosure. FIG. 6 and FIG. 7 respectively are sectional views of the positioning component 16B and the circuit board 12 with different dimensions according to the second embodiment of the present disclosure. In the second embodiment, elements having the same numeral as ones of the first embodiment have the same structures and functions, and a detailed description is omitted herein for simplicity. Difference between the first embodiment and the second embodiment is: the positioning component 16B includes the first annular body 28 and the second annular body 30, and thread structures 36 are respectively formed on an outer surface of the first annular body 28 and an inner surface of the second annular body 30 to be matched with each other. The second annular body 30 can vertically move relative to the first annular body 28 by a rotatable wedging method, to adjust relative height between the first support surface 261 and the second support surface 263.

As shown in FIG. 6, the circuit board 12 is the standard main board with thin dimensions. The aperture of the hole 121 is smaller than the radial dimension of the first support surface 261, and the positioning component 16B contacts against the circuit board 12 via the first support surface 261. The fixing component 32 pierces through the circuit board 12 to be locked inside the hollow structure 34 of the positioning component 16B for complete assembly of the thin circuit board 12. As shown in FIG. 7, the circuit board 12 is fat, the aperture of the hole 121 is greater than the radial dimension of the first support surface 261 and smaller than the radial dimension of the second support surface 263. The circuit board 12 directly contacts against the second support surface 263 of the positioning component 16B. The fixing component 32 pierces through the circuit board 12 and inserts into the hollow structure 34 to lock the circuit board 12 on the positioning component 16B. The fixing mechanism 13 of the second embodiment can adjust relative position between the first annular body 28 and the second annular body 30 according to thickness of the circuit board 12, so that the circuit board 12 with any dimension can be suitable for the fixing mechanism 13 to accurately align the connector 18 with the opening 24 on the casing 14.

Figure 8:
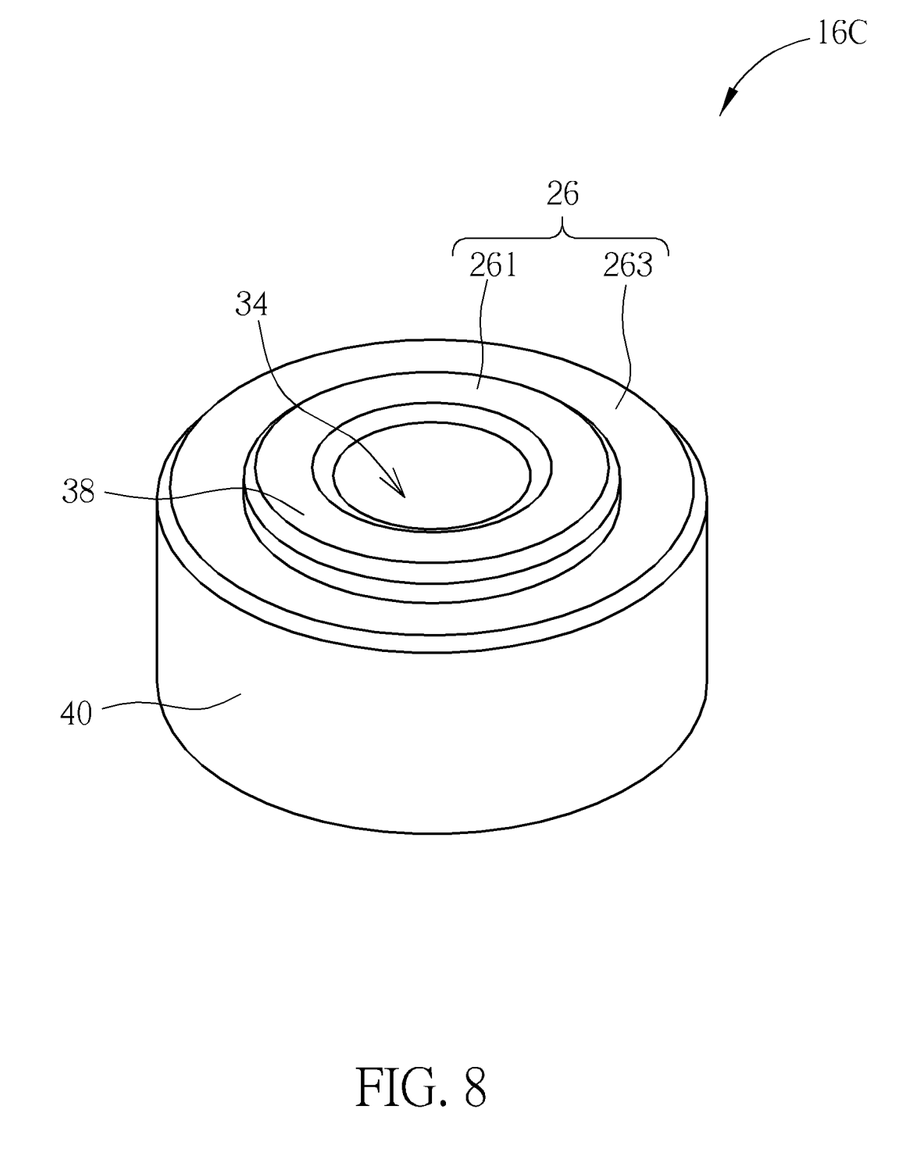
FIG. 8 is a diagram of the positioning component according to a third embodiment of the present disclosure.
Figure 9:
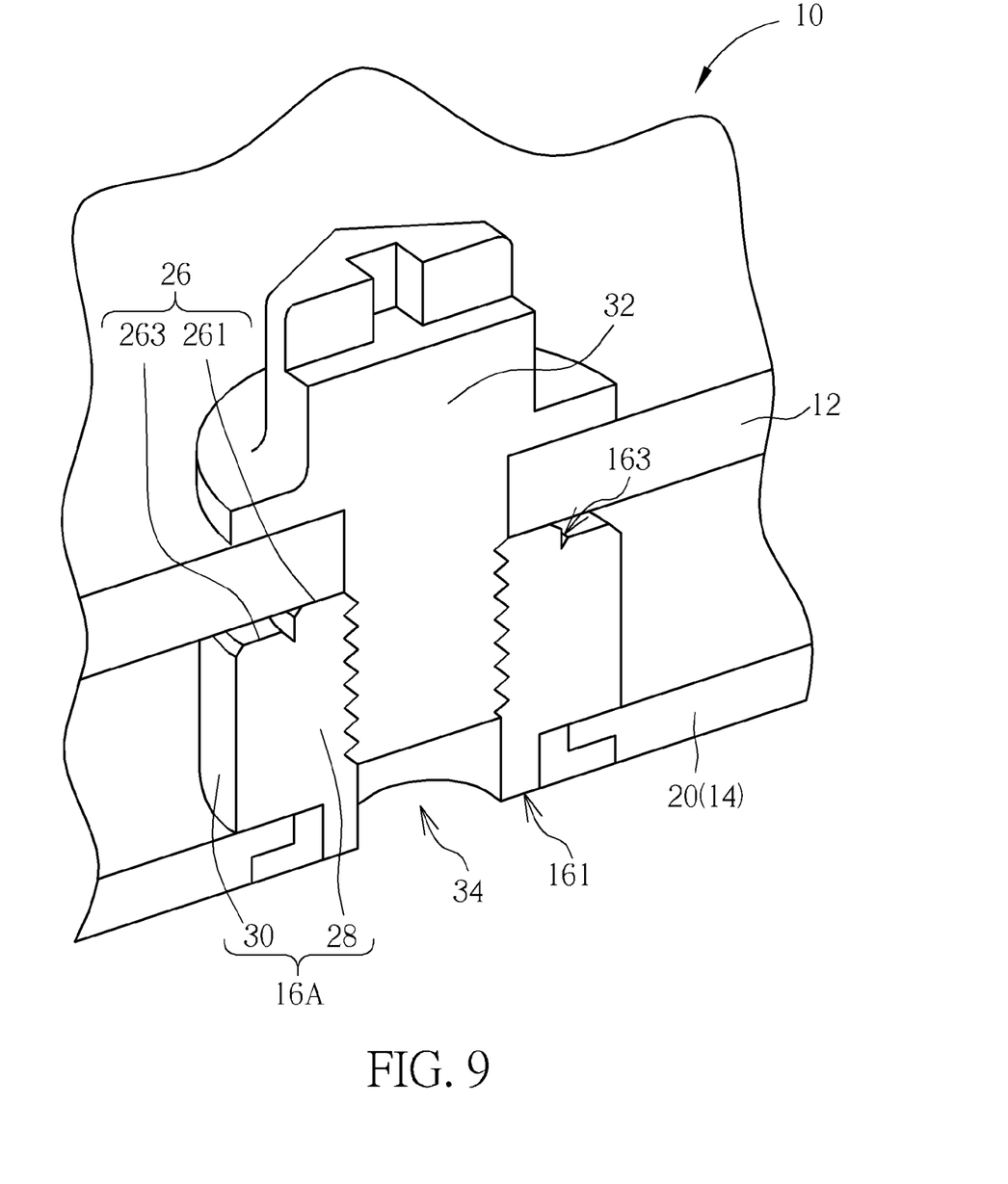
FIG. 9 and FIG. 10 respectively are sectional views of the positioning component and the circuit board with different dimensions according to the third embodiment of the present disclosure.
Figure 10:
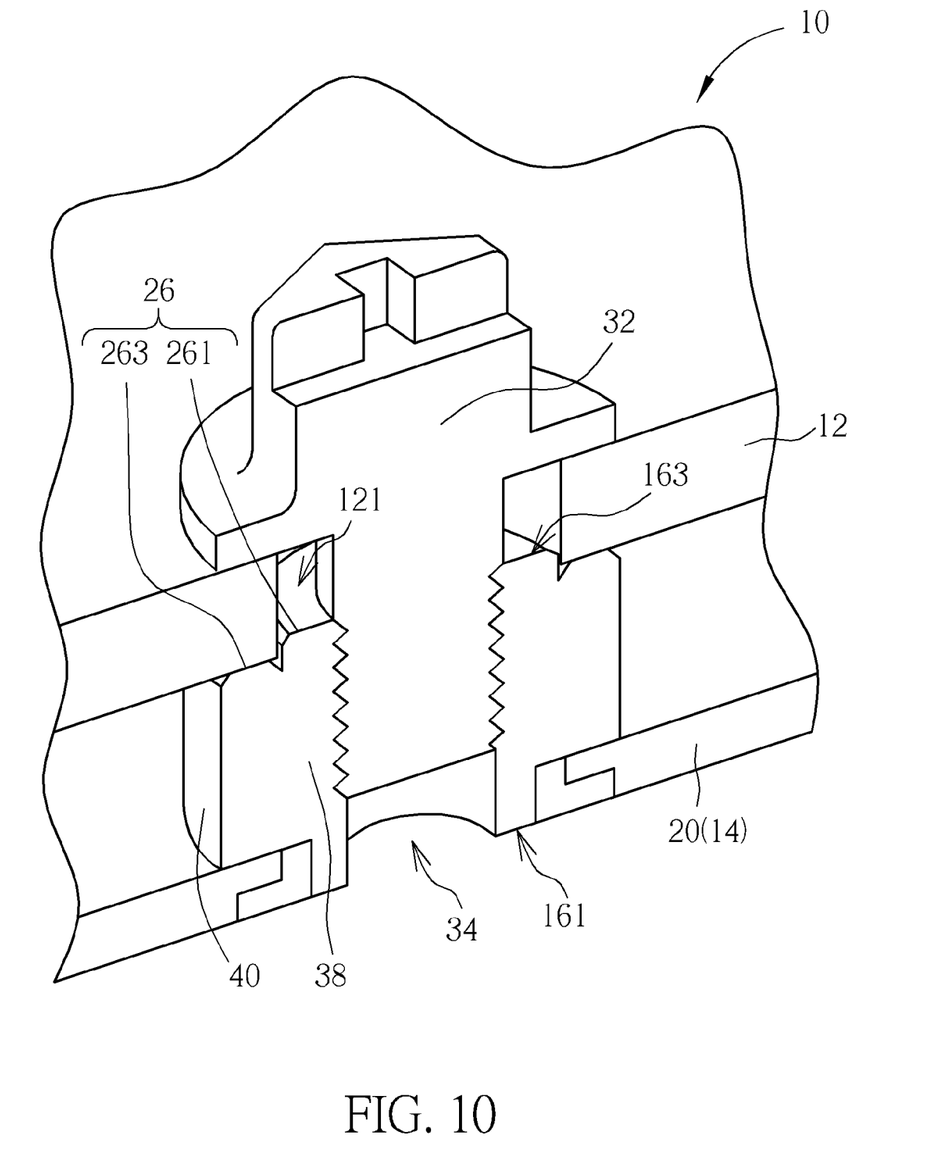

Please refer to FIG. 8 to FIG. 10. FIG. 8 is a diagram of the positioning component 16C according to a third embodiment of the present disclosure. FIG. 9 and FIG. 10 respectively are sectional views of the positioning component 16C and the circuit board 12 with different dimensions according to the third embodiment of the present disclosure. In the third embodiment, elements having the same numeral as ones of the above-mentioned embodiment have the same structures and functions, and a detailed description is omitted herein for simplicity. Difference between the third embodiment and the above-mentioned embodiment is: the positioning component 16C includes the first annular body 38 and the second annular body 40, and the second annular body 40 is integrated with the first annular body 38 monolithically. In addition, a radial dimension of the first annular body 38 is smaller than a radial dimension of the second annular body 40, and a structural height of the first annular body 38 is greater than a structural height of the second annular body 40. The first support surface 261 is formed on the top of the first annular body 38, and the second support surface 263 is formed on the top of the second annular body 30.

As shown in FIG. 9, the circuit board 12 is the standard main board with thin dimensions, the aperture of the hole 121 is smaller than the radial dimension of the first support surface 261, and the positioning component 16C contacts against the circuit board 12 via the first support surface 261. As shown in FIG. 10, the circuit board 12 is fat, the aperture of the hole 121 is designed between the radial dimensions of the first support surface 261 and the second support surface 263. When the circuit board 12 is put on the positioning component 16C, the first annular body 38 inserts into the hole 121 on the circuit board 12, and the top (the second support surface 263) of the second annular body 40 contacts against the circuit board 12. An additional annular body is necessary to be assembled or disassembled according to the thickness variation of the circuit board 12 whereto the positioning component 16A and/or the positioning component 16B are applied; the positioning component 16C includes the level difference structure 26 with several support surfaces, structure of the positioning component 16C is not varied by the thickness of the circuit board 12, and the third embodiment provides preferred convenient operation.

In conclusion, the fixing mechanism of the present disclosure is suitable for the circuit board with any thickness. The thin circuit board or the fat circuit board can respectively contact against the corresponding support surface via the level difference structure of the positioning component, and the connector of the circuit board can accurately align with the opening on the casing no matter what thickness the circuit board has. The fixing mechanism can be easily applied to any kinds of the circuit board without replacement of the positioning component. The positioning component is preferably fixed to the casing by a rivet to constrain a relative movement between the positioning component and the casing for stable orientation. The positioning component is a vertical structure, such as the tube with a flat surface, and ends of the positioning component are respectively connected to the casing and the circuit board. There is more space on the circuit board for circuit configuration because of small contact area between the positioning component and the circuit board, and the casing including the small rivet hole has preferred structural strength. An amount of the support surface of the level difference structure is not limited to the two support surfaces of the above-mentioned embodiment, and depends on actual demand. Comparing to the prior art, the present disclosure provides the fixing mechanism capable of applying to any kinds of the circuit board without replacement of mechanical component, which has advantages of low manufacturing cost and superior assembly convenience.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A fixing mechanism for a circuit board, comprising:
a casing having a base and at least one wall, the wall being bent from the base, and an opening being formed on the wall; and
a positioning component, a bottom of the positioning component being disposed on the base, a level difference structure being disposed on a top of the positioning component, the level difference structure comprising a first support surface and a second support surface, the first support surface being formed on an inner zone of the level difference structure, the second support surface surrounding the first support surface to be formed on an outer zone of the level difference structure, the positioning component being adapted to contact against the circuit board by the first support surface or the second support surface according to a hole formed on the circuit board, so as to align a connector of the circuit board with the opening on the casing.

2. The fixing mechanism of claim 1, wherein a distance between the first support surface and the bottom is substantially greater than a distance between the second support surface and the bottom.

3. The fixing mechanism of claim 1, wherein the positioning component utilizes the first support surface to contact against the circuit board with the small hole.

4. The fixing mechanism of claim 1, wherein the positioning component utilizes the second support surface to contact against the circuit board with the large hole, and the first support surface inserts into the hole.

5. The fixing mechanism of claim 1, wherein the positioning component further comprises a hollow structure, the fixing mechanism further comprises a fixing component, and the fixing component is adapted to pierce through the hole on the circuit board to insert into the hollow structure.

6. The fixing mechanism of claim 1, wherein the positioning component comprises a first annular body and a second annular body, the second annular body is detachably disposed on the first annular body, the first support surface is formed on a top of the first annular body, and the second support surface is formed on a top of the second annular body.

7. The fixing mechanism of claim 6, wherein thread structures are formed on an outer surface of the first annular body and an inner surface of the second annular body, the second annular body moves relative to the first annular body via the thread structures, so as to adjust relative height between the first support surface and the second support surface.

8. The fixing mechanism of claim 1, wherein the positioning component comprises a first annular body and a second annular body, the second annular body is integrated with the first annular body monolithically, a radial dimension of the first annular body is smaller than a radial dimension of the second annular body, the first support surface is formed on a top of the first annular body, and the second support surface is formed on a top of the second annular body.

9. The fixing mechanism of claim 1, wherein the bottom of the positioning component is fixed to the base of the casing by a rivet.

10. The fixing mechanism of claim 1, wherein the positioning component is an erect structure.

11. An electronic device with a circuit board fixing function, the electronic device comprising:
a circuit board having a hole; and
a fixing mechanism for fixing the circuit board, the fixing mechanism comprising:
a casing whereinside the circuit board is disposed, the casing having a base and at least one wall, the wall being bent from the base, and an opening being formed on the wall;
a positioning component, a bottom of the positioning component being disposed on the base, a level difference structure being disposed on a top of the positioning component, the level difference structure comprising a first support surface and a second support surface, the first support surface being formed on an inner zone of the level difference structure, the second support surface surrounding the first support surface to be formed on an outer zone of the level difference structure, the positioning component being adapted to contact against the circuit board by the first support surface or the second support surface according to a hole formed on the circuit board, so as to align a connector of the circuit board with the opening on the casing, the positioning component further comprising a hollow structure; and
a fixing component being adapted to pierce through the hole on the circuit board to insert into the hollow structure of the positioning component.

12. The electronic device of claim 11, wherein a distance between the first support surface and the bottom is substantially greater than a distance between the second support surface and the bottom.

13. The electronic device of claim 11, wherein the positioning component utilizes the first support surface to contact against the circuit board with the small hole.

14. The electronic device of claim 11, wherein the positioning component utilizes the second support surface to contact against the circuit board with the large hole, and the first support surface inserts into the hole.

15. The electronic device of claim 11, wherein the positioning component comprises a first annular body and a second annular body, the second annular body is detachably disposed on the first annular body, the first support surface is formed on a top of the first annular body, and the second support surface is formed on a top of the second annular body.

16. The electronic device of claim 15, wherein thread structures are formed on an outer surface of the first annular body and an inner surface of the second annular body, the second annular body moves relative to the first annular body via the thread structures, so as to adjust relative height between the first support surface and the second support surface.

17. The electronic device of claim 11, wherein the positioning component comprises a first annular body and a second annular body, the second annular body is integrated with the first annular body monolithically, a radial dimension of the first annular body is smaller than a radial dimension of the second annular body, the first support surface is formed on a top of the first annular body, and the second support surface is formed on a top of the second annular body.

18. The electronic device of claim 11, wherein the bottom of the positioning component is fixed to the base of the casing by a rivet.

19. The electronic device of claim 11, wherein the positioning component is an erect structure.

* * * * *